United States Patent
Ji et al.

(10) Patent No.: US 7,203,794 B2
(45) Date of Patent: Apr. 10, 2007

(54) DESTRUCTIVE-READ RANDOM ACCESS MEMORY SYSTEM BUFFERED WITH DESTRUCTIVE-READ MEMORY CACHE

(75) Inventors: Brian L. Ji, Fishkill, NY (US); Chorng-Lii Hwang, Wappingers Falls, NY (US); Toshiaki K. Kirihata, Poughkeepsie, NY (US); Seiji Munetoh, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 11/160,220

(22) Filed: Jun. 14, 2005

(65) Prior Publication Data

US 2005/0226083 A1 Oct. 13, 2005

Related U.S. Application Data

(63) Continuation of application No. 10/710,169, filed on Jun. 23, 2004, which is a continuation of application No. 10/063,466, filed on Apr. 25, 2002, now Pat. No. 6,801,980.

(51) Int. Cl.
*G06F 12/00* (2006.01)
*G06F 13/00* (2006.01)

(52) U.S. Cl. ............................ 711/105; 711/5; 711/100; 711/154

(58) Field of Classification Search ................ 711/100, 711/104, 105, 118, 154, 5; 365/230.01, 235, 365/238.5
See application file for complete search history.

(56) References Cited

U.S. PATENT DOCUMENTS

| | | | |
|---|---|---|---|
| 4,725,945 A | 2/1988 | Kronstadt et al. .......... 364/200 |
| 5,434,530 A | 7/1995 | Ghoshal et al. ............. 327/527 |
| 5,544,306 A | 8/1996 | Deering et al. ............. 395/164 |
| 5,629,889 A | 5/1997 | Chandra et al. ............ 365/162 |
| 5,809,528 A | 9/1998 | Miller et al. ................ 711/136 |
| 5,838,943 A | 11/1998 | Ramagopal et al. ........ 395/394 |
| 6,006,317 A | 12/1999 | Ramagopal et al. .......... 712/23 |
| 6,018,763 A | 1/2000 | Hughes et al. .............. 709/213 |
| 6,065,092 A | 5/2000 | Roy .............................. 711/5 |
| 6,081,872 A | 6/2000 | Matick et al. .............. 711/122 |
| 6,161,208 A | 12/2000 | Dutton et al. ............... 714/764 |
| 6,178,479 B1 | 1/2001 | Vishin ........................ 711/106 |
| 6,205,076 B1 | 3/2001 | Wakayama et al. ......... 365/222 |
| 6,333,883 B2 | 12/2001 | Wakayama et al. ......... 365/205 |
| 6,370,054 B1 * | 4/2002 | Fujisawa et al. .............. 365/63 |
| 6,378,118 B1 | 4/2002 | Sugibayashi .................. 716/8 |
| 6,545,936 B1 * | 4/2003 | Yoo et al. .............. 365/230.05 |
| 6,587,388 B2 | 7/2003 | Kirihata et al. ............. 365/203 |
| 6,639,822 B2 * | 10/2003 | Fujisawa et al. .............. 365/63 |
| 6,697,909 B1 | 2/2004 | Wang et al. ................ 711/106 |
| 6,711,078 B2 | 3/2004 | Brennan et al. ............ 365/205 |

(Continued)

OTHER PUBLICATIONS

PCT Search Report for PCT/US03/10746.

(Continued)

*Primary Examiner*—Tuan V. Thai
(74) *Attorney, Agent, or Firm*—Cantor Colburn LLP

(57) ABSTRACT

A memory storage system includes a plurality of memory storage banks and a cache in communication therewith. Both the plurality of memory storage banks and the cache further include destructive read memory storage elements configured for delayed write back scheduling thereto.

14 Claims, 14 Drawing Sheets

U.S. PATENT DOCUMENTS

2001/0038567 A1 11/2001 Ishikawa ............... 365/230.06
2002/0078311 A1* 6/2002 Matsuzaki et al. .......... 711/149
2002/0161967 A1 10/2002 Kirihata et al. ............. 711/105

OTHER PUBLICATIONS

C. L. Hwang, T. Kirihata, M. Wordeman, J. Fifield, D. Storaska, D. Pontius, G. Fredeman, B. Ji. S. Tomashot, and S. Dhong, "A 2.9ns Random Access Cycle Embedded DRAM with a Destructive-Read Architecture".

T.V. Rajeevakumar, "Josephson Soliton Memory," IBM Technical Disclosure Bulletin, vol. 26 No. 4, Sep. 1983, pp. 2179-2185.

"Method and apparatus for maximizing availabilty of an embedded dynamic memory cache," Research Disclosure, IBM Corp., Apr. 2001, pp. 634-635.

\* cited by examiner

18

|  | BANK ADDRESS | A | B |
|---|---|---|---|
| WORDLINE 0 | 000 | 1 | 0 |
| 1 | 010 | 0 | 0 |
| 2 | 111 | 0 | 1 |
| 3 | 010 | 1 | 0 |
| ... | ... | ... | ... |
| m | 100 | 0 | 1 |

|  | BANK ADDRESS | VALID | REQUEST FLAG | ROW ADDRESS |
|---|---|---|---|---|
| BUFFER 0 | 011 | 1 | 1 | 00101001 |
| BUFFER 1 | 101 | 1 | 0 | |

FIG. 3

| CLOCK 1 | CLOCK 2 | CLOCK 3 | CLOCK 4 |
|---|---|---|---|
| REQUEST 1 | REQUEST 2 | | |
| TAG r 1 | TAG r 2 | | |
| TAG w 1 | TAG w 2 | | |
| | CBANK w 1 | CBANK w 2 | |
| | CBANK r 1 | CBANK r 2 | |
| | BANK w 1 | BANK w 2 | |
| | BANK r 1 | BANK r 2 | |
| | DIN 1 | DIN 2 | |
| | | DOUT 1 | DOUT 2 |

FIG. 5d

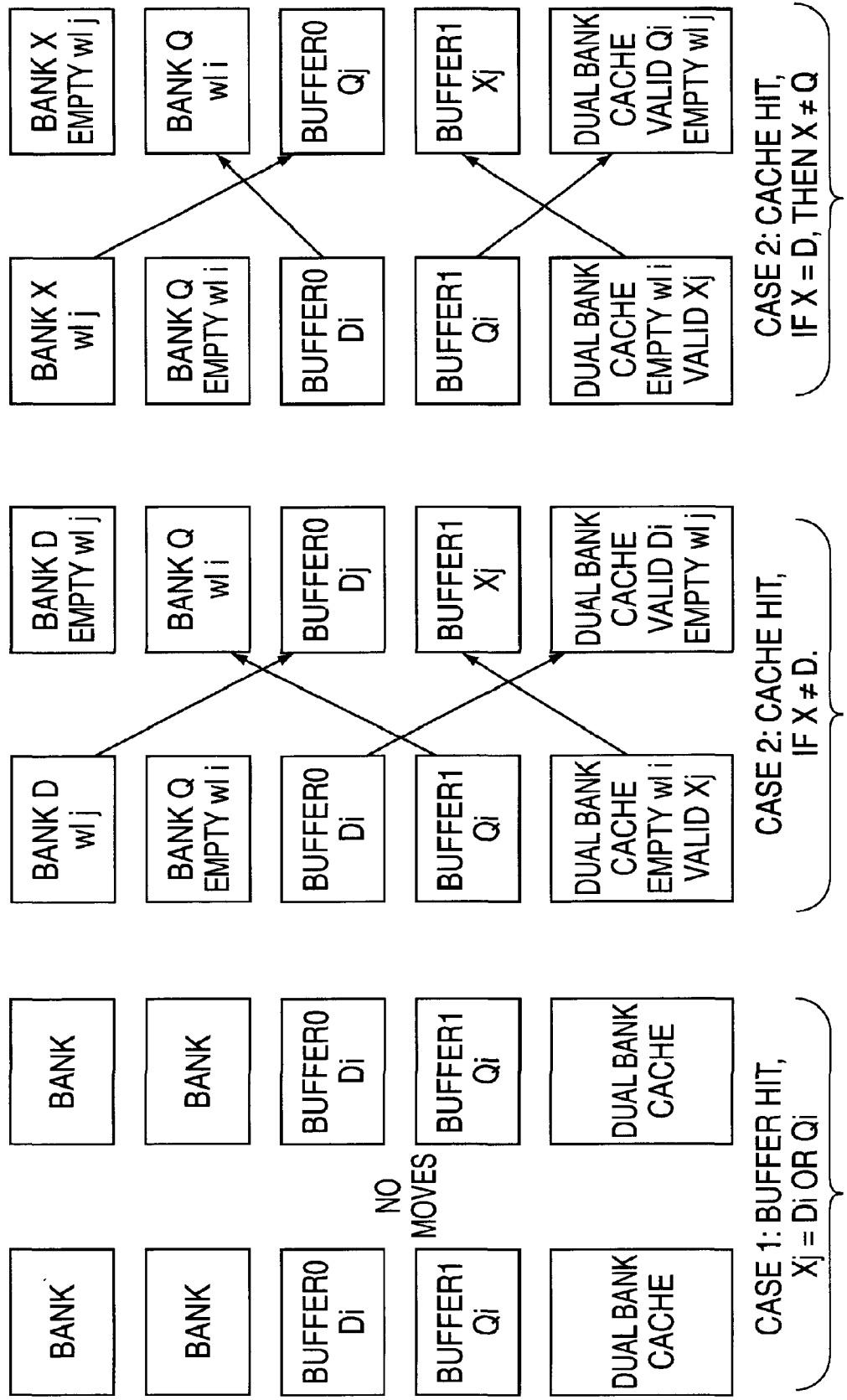

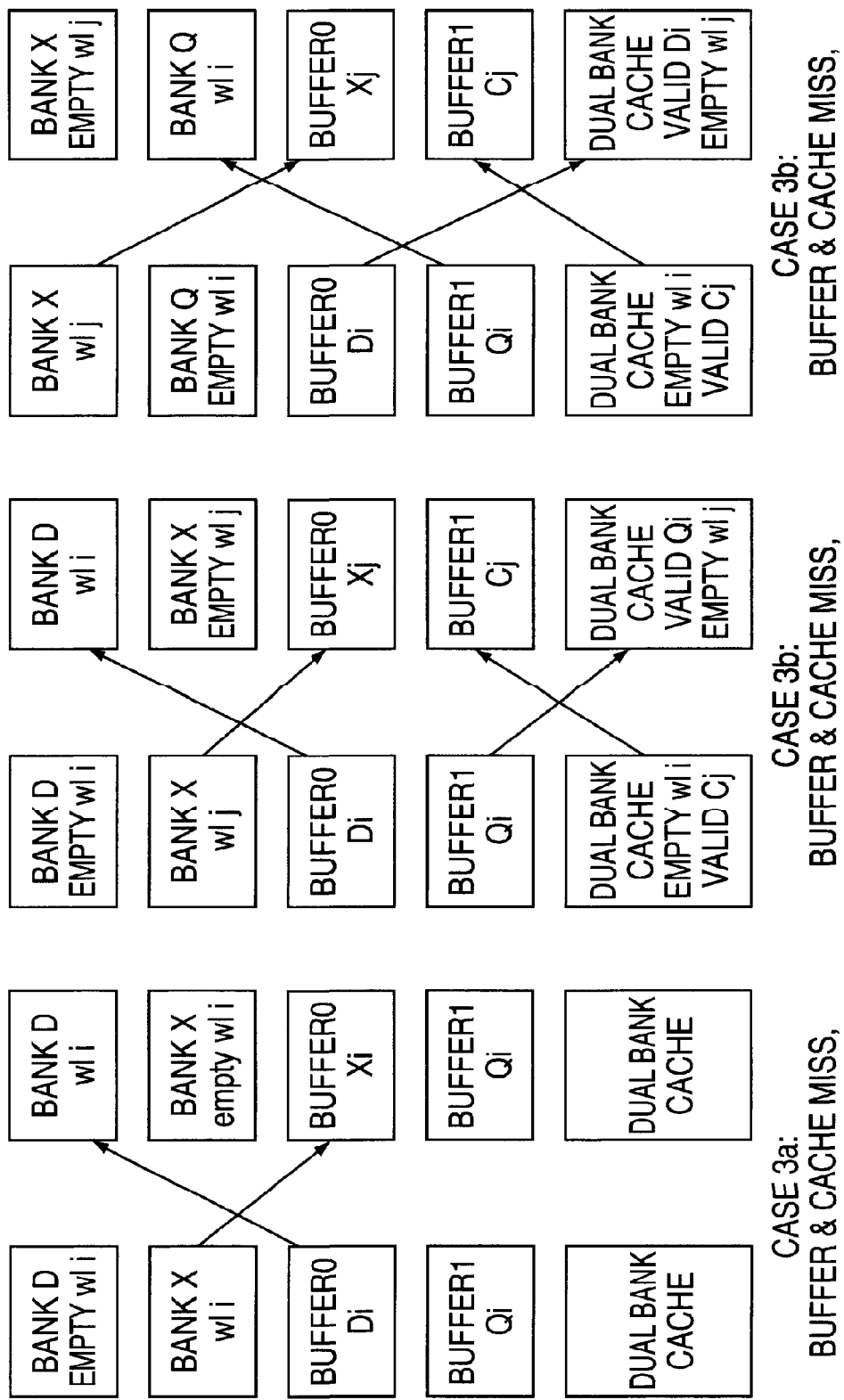

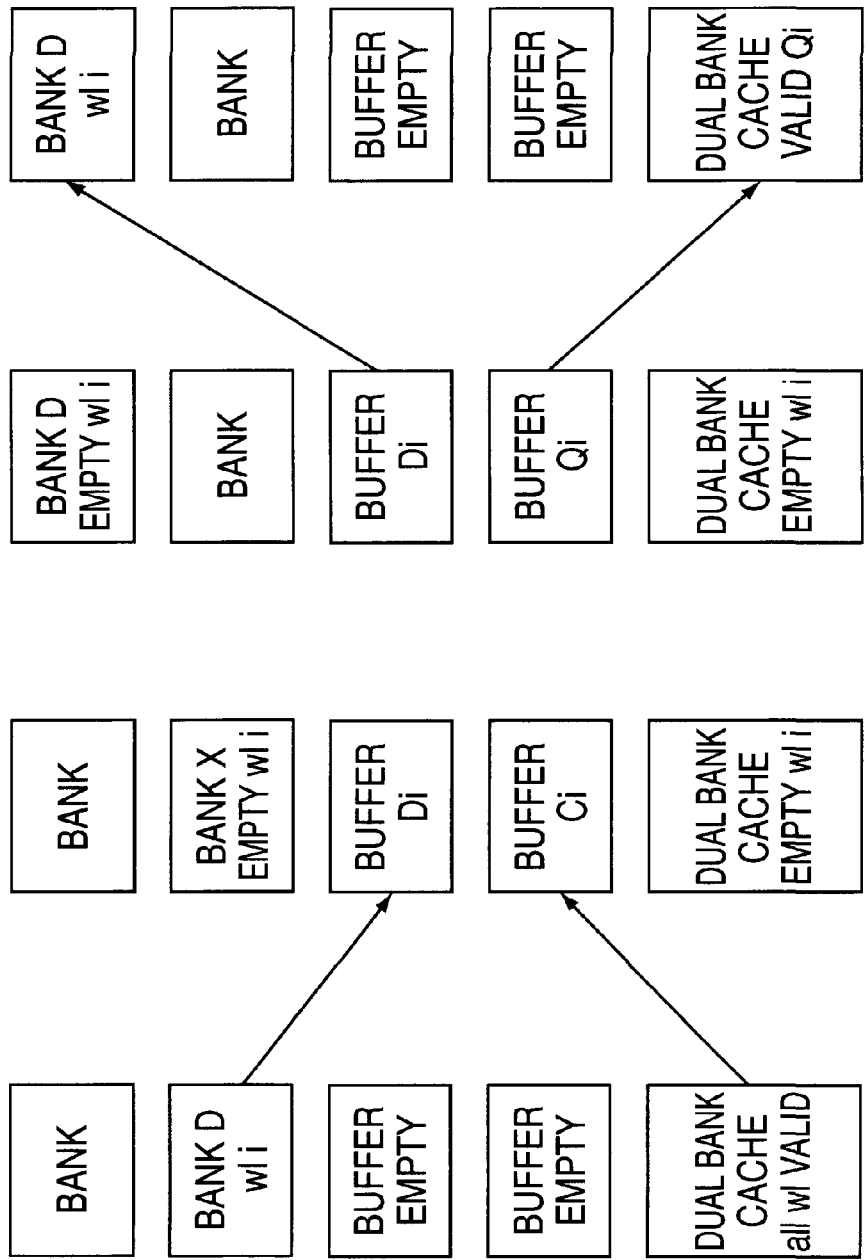

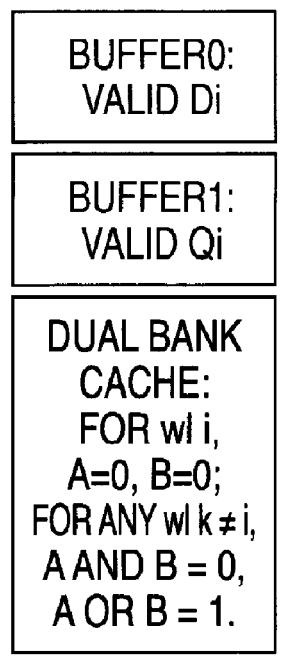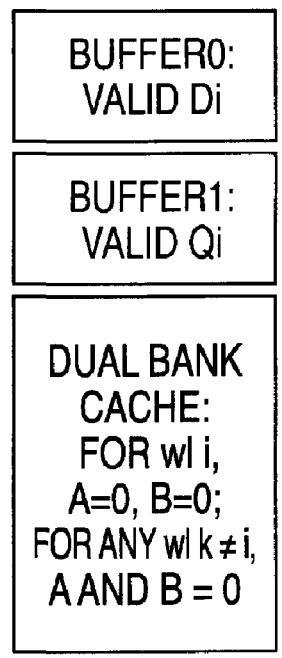
FIG. 9  FIG. 10a
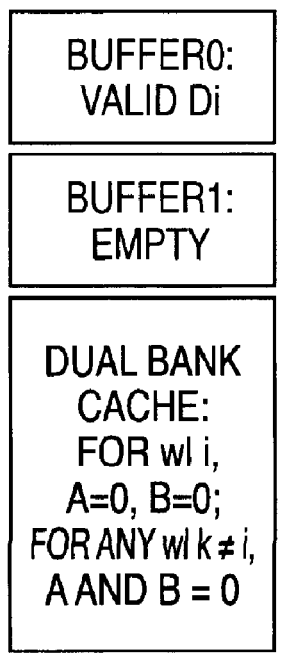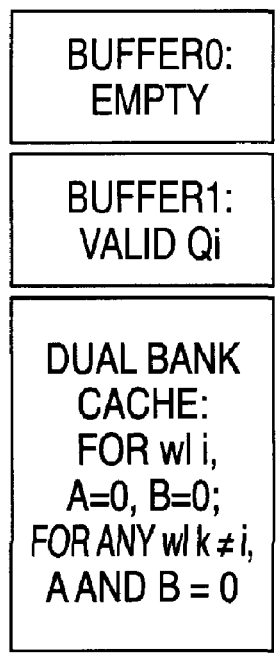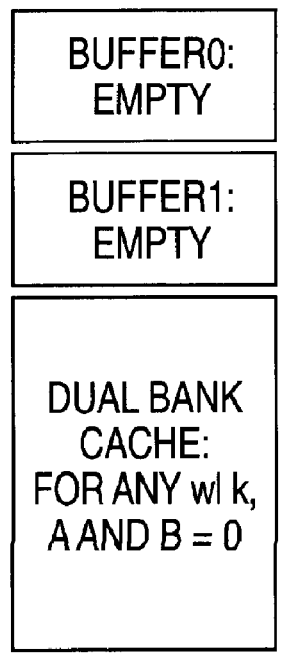
FIG. 10b  FIG. 10c  FIG. 10d

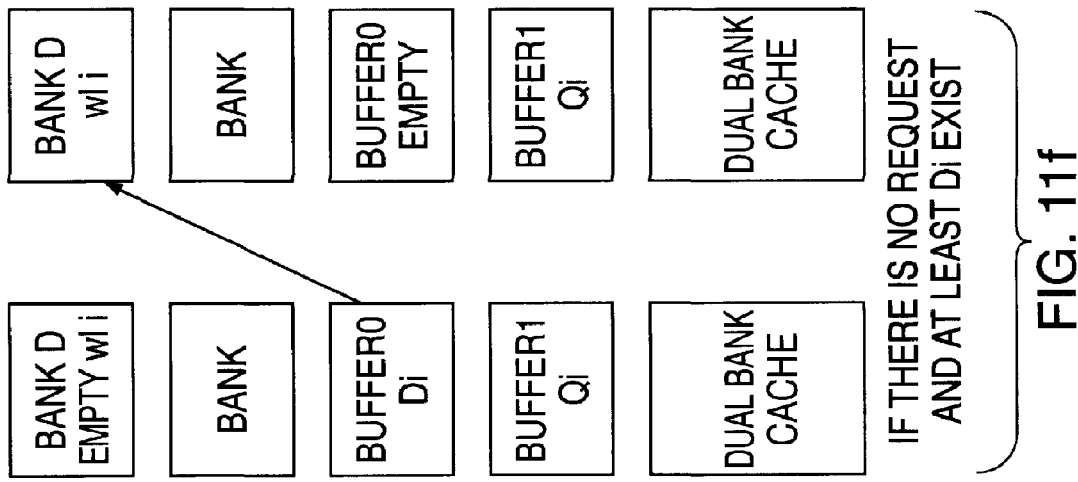
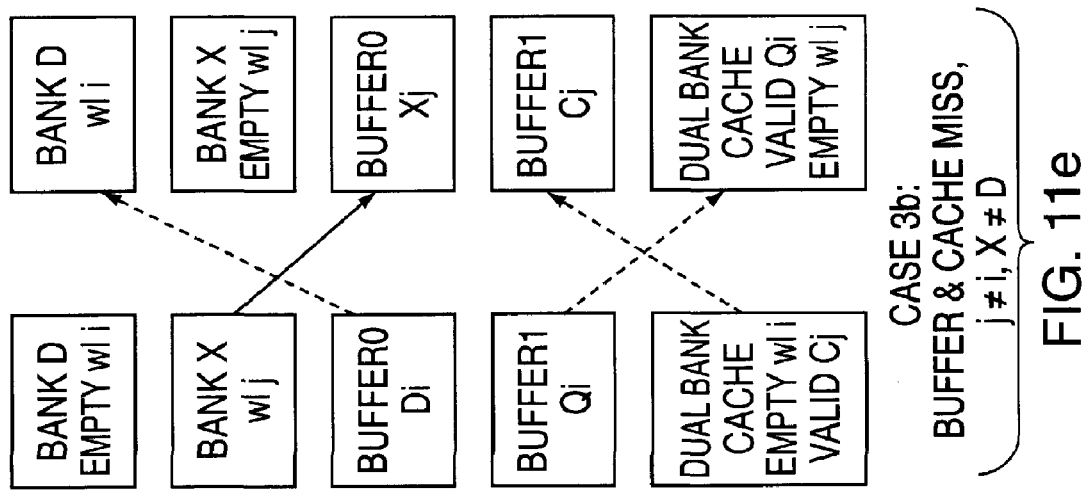
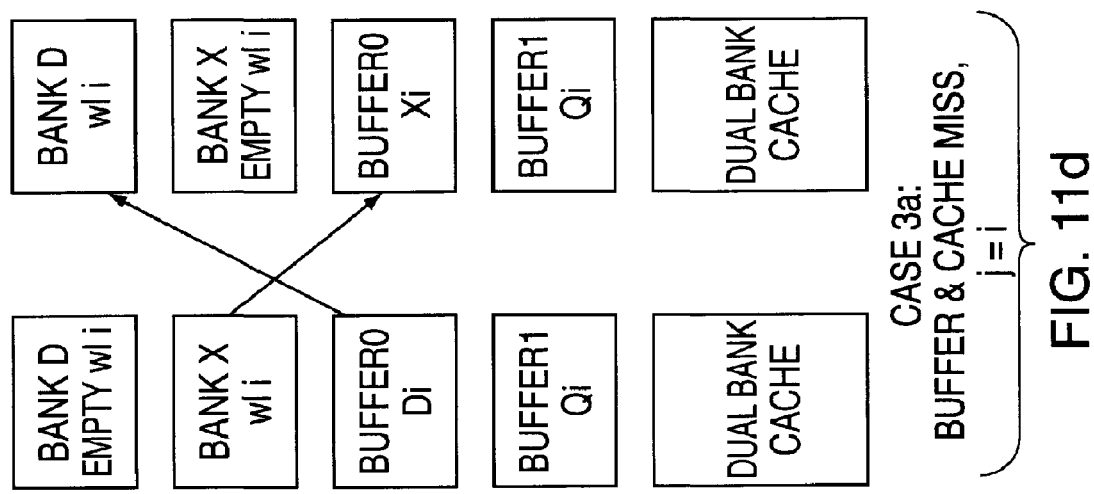

DESTRUCTIVE-READ RANDOM ACCESS MEMORY SYSTEM BUFFERED WITH DESTRUCTIVE-READ MEMORY CACHE

CROSS REFERENCE TO RELATED APPLICATIONS

This application is a continuation application of U.S. Ser. No. 10/710,169, filed Jun. 23, 2004, which is a continuation application of U.S. Ser. No. 10/063,466, filed Apr. 25, 2002, now U.S. Pat. No. 6,801,980, issued Oct. 5, 2004, the contents of which are incorporated by reference herein in their entirety.

BACKGROUND

The present invention relates generally to integrated circuit memory devices and, more particularly, to a random access memory system of destructive-read memory cached by destructive-read memory.

The evolution of sub-micron CMOS technology has resulted in significant improvement in microprocessor speeds. Quadrupling roughly every three years, microprocessor speeds have now exceeded 1 Ghz. Along with these advances in microprocessor technology have come more advanced software and multimedia applications, which in turn require larger memories for the application thereof. Accordingly, there is an increasing demand for larger Dynamic Random Access Memories (DRAMs) with higher density and performance.

DRAM architectures have evolved over the years, being driven by system requirements that necessitate larger memory capacity. However, the speed of a DRAM, characterized by its random access time (tRAC) and its random access cycle time (tRC), has not improved in a similar fashion. As a result, there is a widening speed gap between the DRAMs and the CPU, since the clock speed of the CPU steadily improves over time.

The random access cycle time (tRC) of a DRAM array is generally determined by the array time constant, which represents the amount of time to complete all of the random access operations. Such operations include wordline activation, signal development on the bitlines, bitline sensing, signal write back, wordline deactivation and bitline precharging. Because these operations are performed sequentially in a conventional DRAM architecture, increasing the transfer speed (or bandwidth) of the DRAM becomes problematic.

One way to improve the row access cycle time of a DRAM system for certain applications is to implement a destructive read of the data stored in the DRAM cells, and then temporarily store the destructively read data into a buffer cell connected to the sense amplifier of the same local memory array. (See, for example, U.S. Pat. Nos. 6,205,076 and 6,333,883 to Wakayama, et al.) In this approach, different wordlines in a local memory array connected to a common sense amplifier block can be destructively read sequentially for a number of times, which is set by one plus the number of the buffer cells per sense amplifier. However, the number of buffer cells that can be practically implemented in this approach is small, due to the large area required for both the buffer cells and associated control logic for each local DRAM array. Furthermore, so long as the number of buffer cells is less than the number of wordlines in the original cell arrays, this system only improves access cycle time for a limited number of data access cases, rather than the random access cycle time required in general applications.

A more practical way to improve the random access cycle time of a DRAM system is to implement a destructive read of the data stored in the DRAM cells, and then temporarily store the destructively read data into an SRAM based cache outside of the main memory array. The SRAM based cache has at least the same number of wordlines as one, single-bank DRAM array. (The term "bank" as described herein refers to an array of memory cells sharing the same sense amplifiers.) This technique is described in U.S. patent application Ser. No. 09/843,504, entitled "A Destructive Read Architecture for Dynamic Random Access Memories", filed Apr. 26, 2001, and commonly assigned to the assignee of the present application. In this technique, a delayed write back operation is then scheduled for restoring the data to the appropriate DRAM memory location at a later time. The scheduling of the delayed write back operation depends upon the availability of space within the SRAM based cache. While such an approach is effective in reducing random access cycle time, the use of an SRAM based cache may occupy an undesired amount of chip real estate, as well as result in more complex interconnect wiring to transfer data between the DRAM and the cache. Where chip area is of particular concern, therefore, it becomes desirable to reduce random access cycle time without occupying a relatively large device area by using an SRAM based cache.

SUMMARY

The above discussed and other drawbacks and deficiencies of the prior art are overcome or alleviated by a memory storage system including a plurality of memory storage banks and a cache in communication therewith. Both the plurality of memory storage banks and the cache further include destructive read memory storage components configured for delayed write back scheduling thereto.

In another embodiment, a dynamic random access memory (DRAM) system, includes a number (n) of DRAM storage banks, each of the n DRAM storage banks having a number (m) of wordlines associates therewith. A cache includes a first DRAM cache bank and a second DRAM cache bank, both the first DRAM cache bank and the second DRAM cache bank having the number m of wordlines associated therewith. A line buffer structure includes a pair of buffers capable of storing data read from the DRAM storage banks and the first and second DRAM cache banks. A control algorithm controls the transfer of data between the DRAM storage banks, the pair of buffers and the DRAM cache banks. Data read from the DRAM storage banks and the DRAM cache banks is destructively read therefrom in a manner that provides for a delayed write back of data thereto.

BRIEF DESCRIPTION OF THE DRAWINGS

Referring to the exemplary drawings wherein like elements are numbered alike in the several Figures:

FIG. 2 is a table which illustrates the structure of a cache tag included in the DRAM system;

FIG. 3 is a table which illustrates the structure of a buffer tag included in the DRAM system;

FIG. 5(d) is a table illustrating a pipeline scheme associated with the buffer structure of FIG. 5(c);

FIGS. 6(a)–6(f) are state diagrams representing various data transfer operations under a strong form algorithm used in conjunction with the DRAM system;

FIG. 7 is a state diagram illustrating an initialization procedure used in the strong form algorithm;

FIG. 8 is state diagram illustrating an optional data transfer operation in the strong form algorithm;

FIG. 9 is a state table illustrating the allowable states under the strong form algorithm;

FIGS. 10(a)–10(d) are state tables illustrating allowable states under a general form algorithm which alternatively may be used in conjunction with the dram system; and FIGS. 11(a)–11(f) are state diagrams representing various data transfer operations under the general form algorithm used in conjunction with the DRAM system.

DETAILED DESCRIPTION

Disclosed herein is a random access memory system based upon a destructive-read memory that is also cached by destructive read memory. A destructive-read memory describes a memory structure that loses its data after a read operation is performed, and thus a subsequent write-back operation is performed to restore the data to the memory cells. If the data within DRAM cells are read without an immediate write-back thereto, then the data will no longer reside in the cells thereafter. As stated above, one way to improve random access cycle time has been to operate a memory array in a destructive read mode, combined with scheduling of a delayed write back using a SRAM data cache. As also stated previously, however, existing SRAM devices occupy more device real estate, and usually include four or more transistors per cell as opposed to a DRAM cell having a single access transistor and storage capacitor. Accordingly, the present invention embodiments allow the same destructive read DRAM banks to also function as the cache, thereby saving device real estate, among other advantages to be discussed hereinafter.

Briefly stated, in the present embodiments, the data that is destroyed by being read from a plurality of DRAM banks are now cached by (i.e., written to) a dual bank DRAM data cache that is also operated in a destructive read mode. In addition to the DRAM banks and the dual-bank cache, there are also included a pair of register line buffers, each for storing for a single page of data. A cache tag stores the bank information for each wordline of the cache, as well as flags to indicate if a particular bank in the dual-bank cache has valid data present. There is also a buffer tag that, for each buffer, contains a flag indicating if valid data exists therein, as well as the bank and row information associated with the data. Another flag indicates which one of the two buffers may contain the randomly requested data from the previous cycle.

As will also be described in greater detail, based upon a concept of "rules of allowable states", one or more path independent algorithms may be devised to determine data transfer operation to be implemented in preparation for the next clock cycle. The data transfer operations (i.e., moves) will depend on only the current state of the data in the DRAM banks, the cache and the buffers, rather than the history preceding the current state. For ease of understanding, the following detailed description is organized into two main parts: (1) the system architecture; and (2) the scheduling algorithms implemented for the architecture.

I. System Architecture

Figure 1:
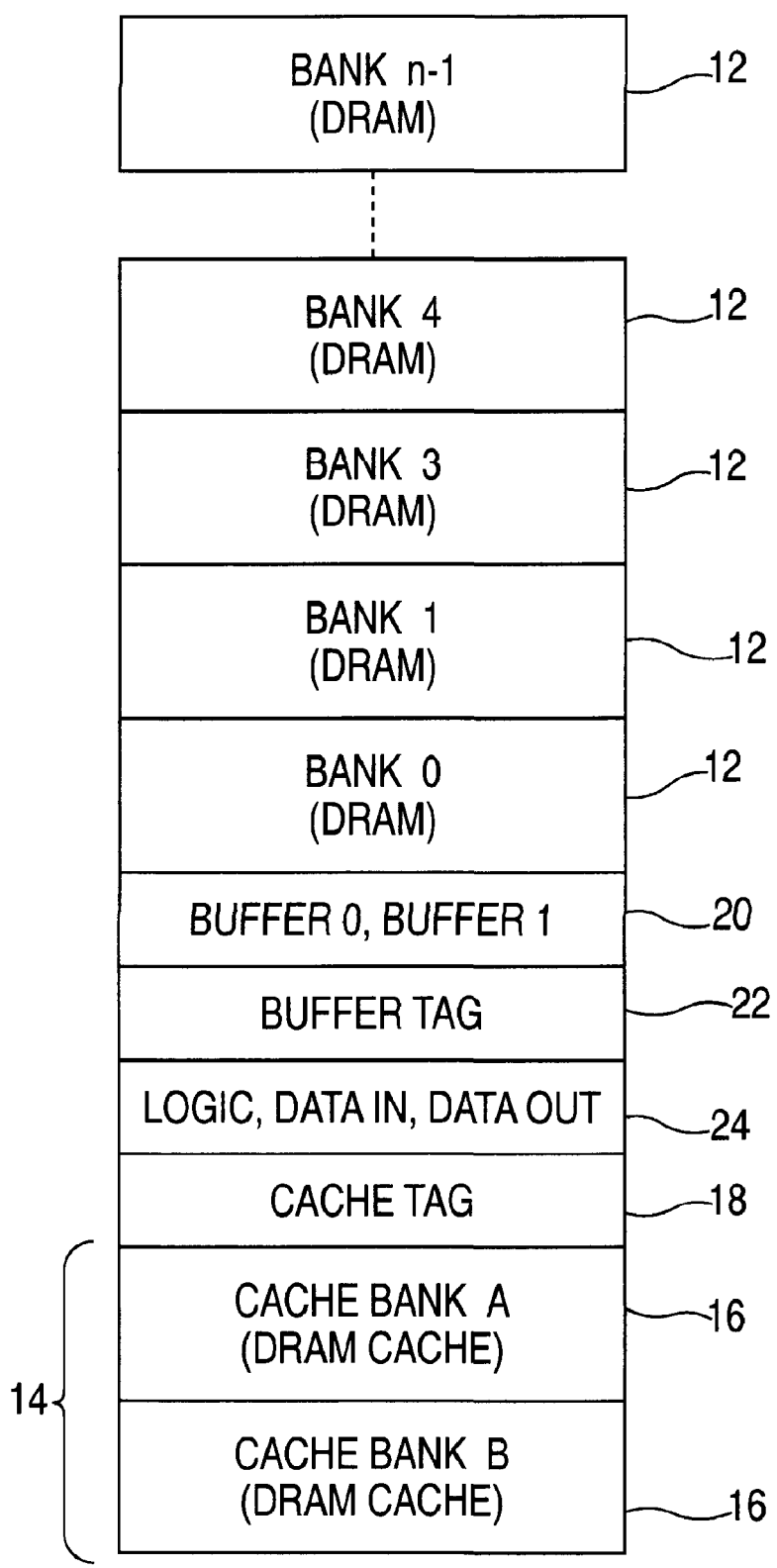
FIG. 1 is a schematic block diagram of a destructive read, dynamic random access memory (DRAM) system, in accordance with an embodiment of the invention.

Referring initially to FIG. 1, there is shown a schematic block diagram of a destructive read, dynamic random access memory (DRAM) system 10. The DRAM system 10 includes a plurality of n DRAM storage banks 12 (individually designated BANK 0 through BANK n−1), a destructive read DRAM cache 14 including dual cache banks 16, a cache tag 18, a pair of register line buffers 20 (individually designated as buffer 0 and buffer 1), a buffer tag 22, and associated logic circuitry 24. It will be noted that the terms "bank" or "BANK" used herein refer to a memory cell array sharing a common set of sense amplifers.

The associated logic circuitry 24 may further include receiver/data in elements, OCD/data out elements, and other logic elements. Unlike existing cache, the two DRAM cache banks 16 may be identical (in both configuration and performance) to the n normal DRAM banks 12. Accordingly, the system 10 may also be considered as having an n+2 bank architecture, wherein n DRAM banks are used for conventional memory storage and 2 DRAM banks are used as cache. Hereinafter, the two DRAM banks 16 used for the cache 14 will be referred to as "cache banks", individually designated as CBANK A and CBANK B.

Each DRAM bank 12 (BANK 0 to n−1) and cache bank 16 (CBANK A, B) has the same number of wordlines and bitlines. In a preferred embodiment, the same array support circuitry (e.g., wordline driver and sense amplifier configurations) may support both the DRAM banks 12 and the cache banks 16. Alternatively, different array configurations for each DRAM bank 12 (BANK 0 to n−1) and each cache bank 16 (CBANK A, B) may be used, so as long as each cache bank 16 (CBANK A, B) contains at least the same number of wordlines and bitlines as the DRAM banks 12 (BANK 0 to n−1).

Both cache banks 16 share the cache tag 18 in a direct mapping cache scheme. Data associated with a particular wordline address (e.g., wordline 0) of one of the DRAM banks 12 may be stored in that particular wordline of one of the two cache banks 16 (either A or B) but not both. This allows the cache 14 to read the data from one of the DRAM banks 12 while writing new data to another DRAM bank 12. The structure of the cache tag 18 is illustrated in FIG. 2. As can be seen, for each wordline (numbered 0 through m) the cache tag 18 stores the DRAM bank address information (shown in this example as a 3-bit encoded bank address), as well as an indication of the presence of data in the wordlines of cache banks CBANK A and CBANK B. "A" and "B" flags indicate whether valid data exists in the CBANK A, CBANK B, or neither. In the example illustrated, wordline 0 of CBANK A contains valid data from (DRAM) BANK 0, wordline 0. Also, wordline 2 of CBANK B contains valid data from BANK 7, wordline 2, while wordline 3 of CBANK A contains valid data from BANK 3, wordline 3.

Each of the two line buffers 20 is capable of storing a single page of data (i.e., a word). The line buffers 20 may be made of a register array, and each has separate input and output ports. FIG. 3 illustrates the structure of the buffer tag 22, which includes the bank address, the row address (an 8-bit encoded address in this example), a valid flag and a request flag for each buffer 20. However, as will be discussed later, the row address associated with each buffer 20 should be the same in a preferred embodiment, thus it is shared between the two buffers. The valid flag indicates whether the data in the buffer is valid. The request flag indicates if the buffer 20 (either buffer 0 or buffer 1) contains the previously requested data for a particular bank and row address for either read to data-out (OCDs) or write from data_in (receivers).

Referring now to FIG. 4, there is shown a schematic diagram that illustrates the structure of the two buffers 20 (buffer 0 and buffer 1) for each data in/out pin. The buffers 20 are used to handle the traffic of data transfers between the DRAM banks (BANK 0 to n−1) and cache 14 (CBANK A, B) while avoiding any potential data contention on the data lines. A data_in/data_out bus 30 (including data_in line 30a and data_out line 30b) is connected to both buffer 0 and buffer 1 through a plurality of corresponding transfer gates 32 controlled by read/write signals gw0/gr0 and gw1/gr1, respectively. The data_in/data_out bus 30 provides an external interface between the DRAM system 10 and any external devices (customers) that read from or write to the system.

A read secondary data line (RSDL) 34 is a unidirectional signal bus that connects the output of a sense amplifier (SA) or secondary sense amplifier (SSA) (not shown) in the DRAM bank array to buffer 0, through a transfer gate 36 controlled by signal r0. In other words, any data read from one of the DRAM banks 12 into the buffer 20 is sent to buffer 0 through RSDL 34. Similarly, CRSDL (cache read secondary data line) 38 is unidirectional signal bus that connects the output of a sense amplifier (SA) or secondary sense amplifier (SSA) (not shown) associated with the cache 14 to buffer 1, through a transfer gate 40 controlled by signal r0. In other words, any data read from one of the cache banks 16 into the buffer 20 is sent to buffer 1 through CRSDL 38.

In addition, a write secondary data line (WSDL) 42 is a unidirectional signal bus that connects outgoing data from either buffer 0 or buffer 1 back to the DRAM banks 12. This is done through multiplexed transfer gates 44 controlled by signals w00 and w10. Correspondingly, a cache write secondary data line (CWSDL) 46 is a unidirectional signal bus that connects outgoing data from either buffer 0 or buffer 1 to the cache banks 16. This is done through multiplexed transfer gates 48 controlled by signals w01 and w11.

Figure 4A:
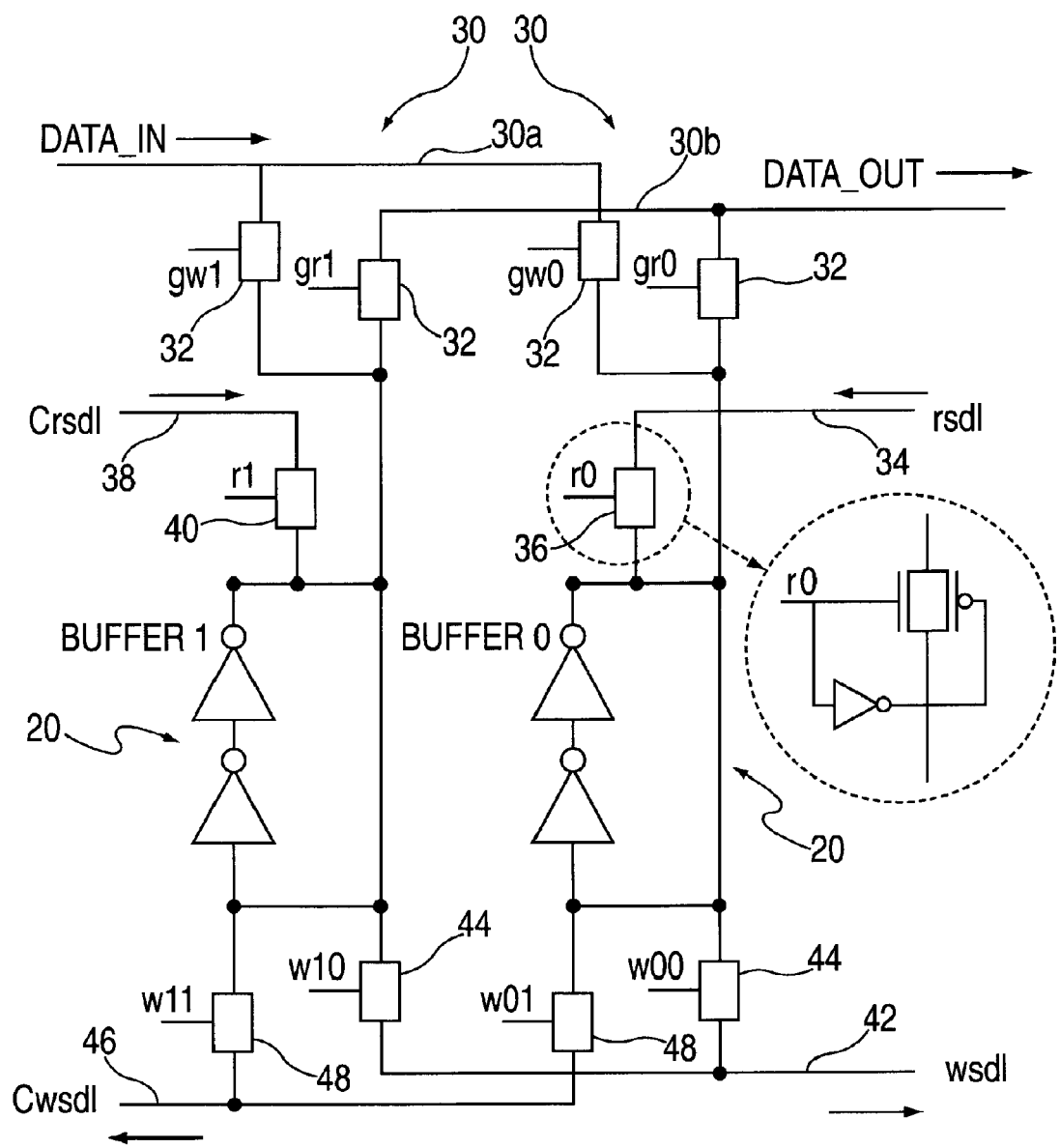
FIG. 4(a) is a schematic diagram which illustrates one embodiment of a buffer structure included in the DRAM system.
Figure 4B:
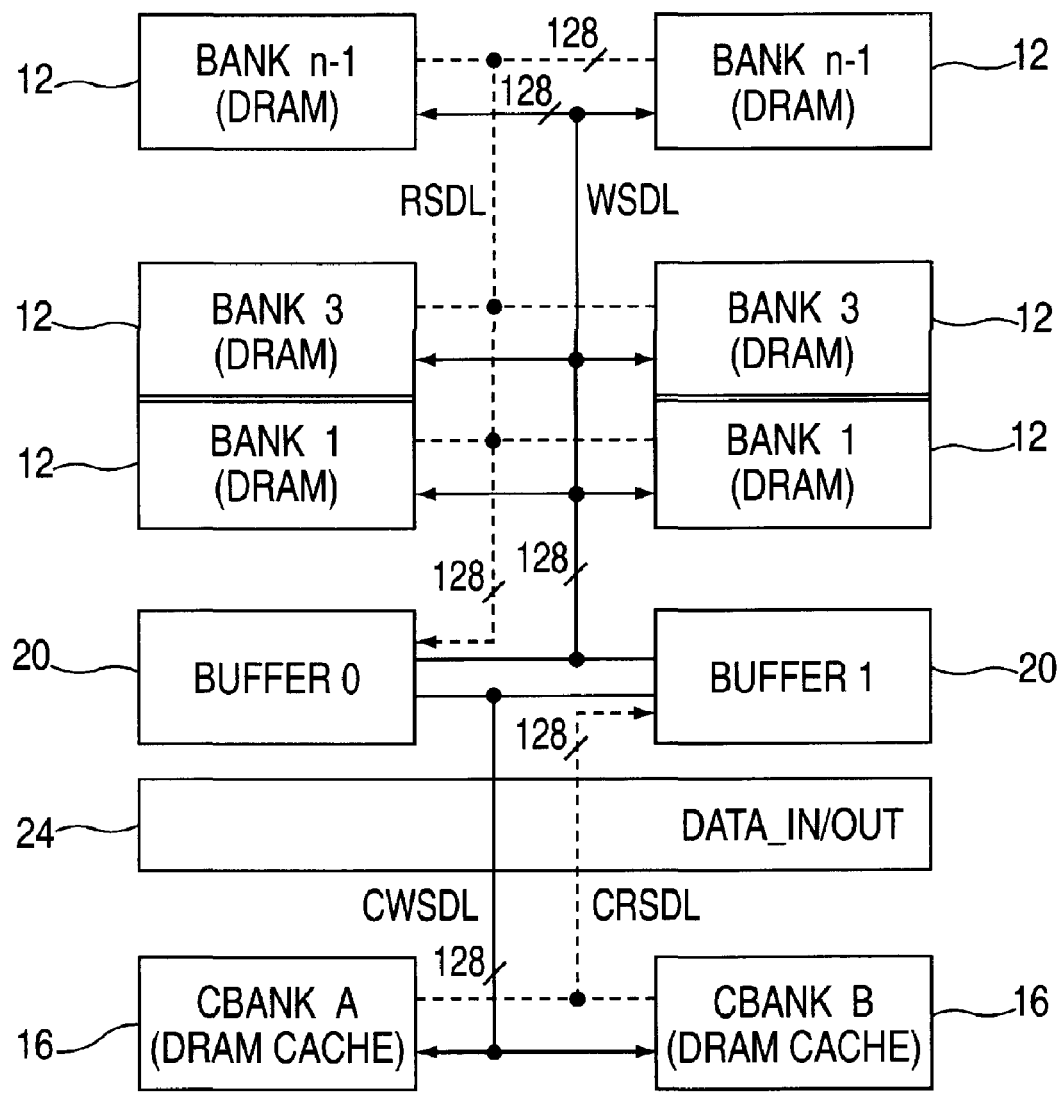
FIG. 4(b) is a schematic diagram which illustrates exemplary connections for data lines shown in FIG. 4(a)

FIG. 4(b) is a schematic diagram which illustrates exemplary connections for data lines WSDL, RSDL, CWSDL and CRSDL between n DRAM banks, two DRAM cache banks and two buffers. By way of example, the width of the data lines is assumed to be 128 bits.

Although the buffer structure is implemented by using level sensitive latches shown in FIG. 4(a), an alternative scheme based on edge triggered latches and pipelined tag comparisons may also implemented, as will be discussed later. Furthermore, it will be noted that under the present embodiment, buffer structure of FIG. 4(a) is defined such that: data incoming from the DRAM banks 12 is always stored in buffer 0; data incoming from the cache banks 16 is always stored in buffer 1; and data outgoing from buffer 0 and buffer 1 can go to either the DRAM banks 12 or the cache banks 16. However, it will be appreciated that the structure could be reversed, such that data coming into the buffers from the DRAM banks 12 or the cache banks 16 could be stored in either buffer, whereas data written out of a particular buffer will only go to either the DRAM banks or the cache banks 16.

For an understanding of the operation of the DRAM system 10, a single clock cycle operation is discussed hereinafter, with ¼ clock setup times of command and address signals are assumed to be used for tag comparison. A single cycle operation means that each DRAM bank (including the cache banks) can finish a read or write operation in one clock cycle. In each clock cycle, there will be no more than one read operation from a DRAM bank, no more than one read operation from a cache bank, no more than one write operation to a DRAM bank, and no more than one write operation to a cache bank. Therefore, up to four individual read or write operations between the DRAM bank and the cache may occur during each cycle, while still allowing successful communication with the two buffers. With each data transfer operation, the communication is enabled through one of the two buffers.

Figure 5A:
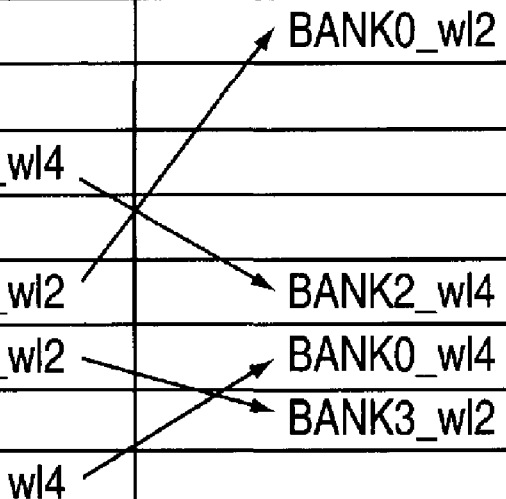
FIG. 5(a) is a table illustrating examples of possible data transfer operations allowed under the DRAM system configuration.

FIG. 5(a) is a table illustrating examples of each of the four possible data transfer operations allowed under the present system configuration. For example, during a random access request for the data stored in BANK 2, wordline 4 (abbreviated bank2_wl4), the following operations could take place:
 (1) move the data previously in buffer 0 (e.g., from bank0_wl2) back to BANK 0;
 (2) move the data out from bank2_wl4 to buffer 0;
 (3) move the data previously in buffer 1 (e.g., from bank3_wl2) to a cache bank (e.g. CBANK A); and
 (4) move the data from wordline 4 in CBANK B (e.g., bank0_wl4) to buffer 1.

Because there are at least two DRAM banks, two buffers, and two cache banks, all four of the above data transfer operations may be enabled simultaneously.

As will be explained in further detail later, the above series of exemplary operations during a clock cycle are generally determined based upon the requested command (if any) and the existing state of the data. A series of allowable states will be defined, and an algorithm will be implemented which upholds the rules of allowable states. In the context of the above example in FIG. 5(a), immediately prior to the request for data in bank2_wl4, buffer 0 initially contains the data bits previously read from the cells associated with the second wordline in DRAM bank 0 (bank0_wl2). In addition, buffer 1 initially contains the data bits previously read from the cells associated with the second wordline in DRAM bank 3 (bank3_wl2). The cache tag 18 maintains the bank address information associated with each wordline in cache banks, as well as whether any valid data is in the A or B bank. Specifically, the above example assumes that cache bank B initially contains the data bits previously read from the fourth wordline in DRAM bank 0 (bank 0_wl4). All of these initial states are known from the previous clock cycle.

When the new command (Request bank2_wl4) is received during the setup time, a tag comparison is done. The tag comparison determines if a requested data is a buffer hit, a cache hit, or a buffer & cache miss (i.e., DRAM bank hit). In this example, the requested data is neither in the buffers nor the cache, and thus the comparison result is considered a DRAM bank hit. In other words, the requested data is actually in its designated DRAM bank location. In addition to locating the requested data, the tag comparison also checks to see if there is any valid data in either of the cache banks at the same wordline address as in the request (e.g., wl4). The result in this example is valid data from DRAM bank 0, wordline 4 (bank0_wl4) is found in cache bank B.

Because the present system employs a direct mapping scheduling, the data bits from bank0_wl4 should not be stored in either cache bank for future scheduling. Thus, the data bits from bank0_wl4 are to be transferred to buffer 1. Meanwhile, the requested data bank2_wl4 needs to be transferred to buffer 0 to be subsequently retrieved by the customer. However, the data initially in buffer 0 (bank0_wl2) must first be returned to its location in the DRAM banks (i.e., BANK 0, wordline 2), which DRAM bank is different from the bank in the request. Since both buffers contain valid data, one of them will be associated with a DRAM bank number that is not the same number as the requested DRAM bank. Buffer 0 is checked first, and through the tag comparison it is determined that it is not associated with the same DRAM bank number as in the request, so the data in buffer 0 is sent back to DRAM bank 0. The data in the other buffer, i.e., the data bits from bank3_wl2 in buffer 1, will be transferred to cache bank A.

A fundamental data transferring principle or the present system is to store up to two data pages having the same wordline number in two buffers as a pair. One is used for the requested data page, while the other, if necessary, is used for transferring a valid data page (having a particular wordline address corresponding to the same wordline address as the requested data) out of the cache so to avoid data overflow in future cycles. So long as this pairing rule is followed, the data transfer integrity is fully maintained without losing any bank data.

Figure 5B:
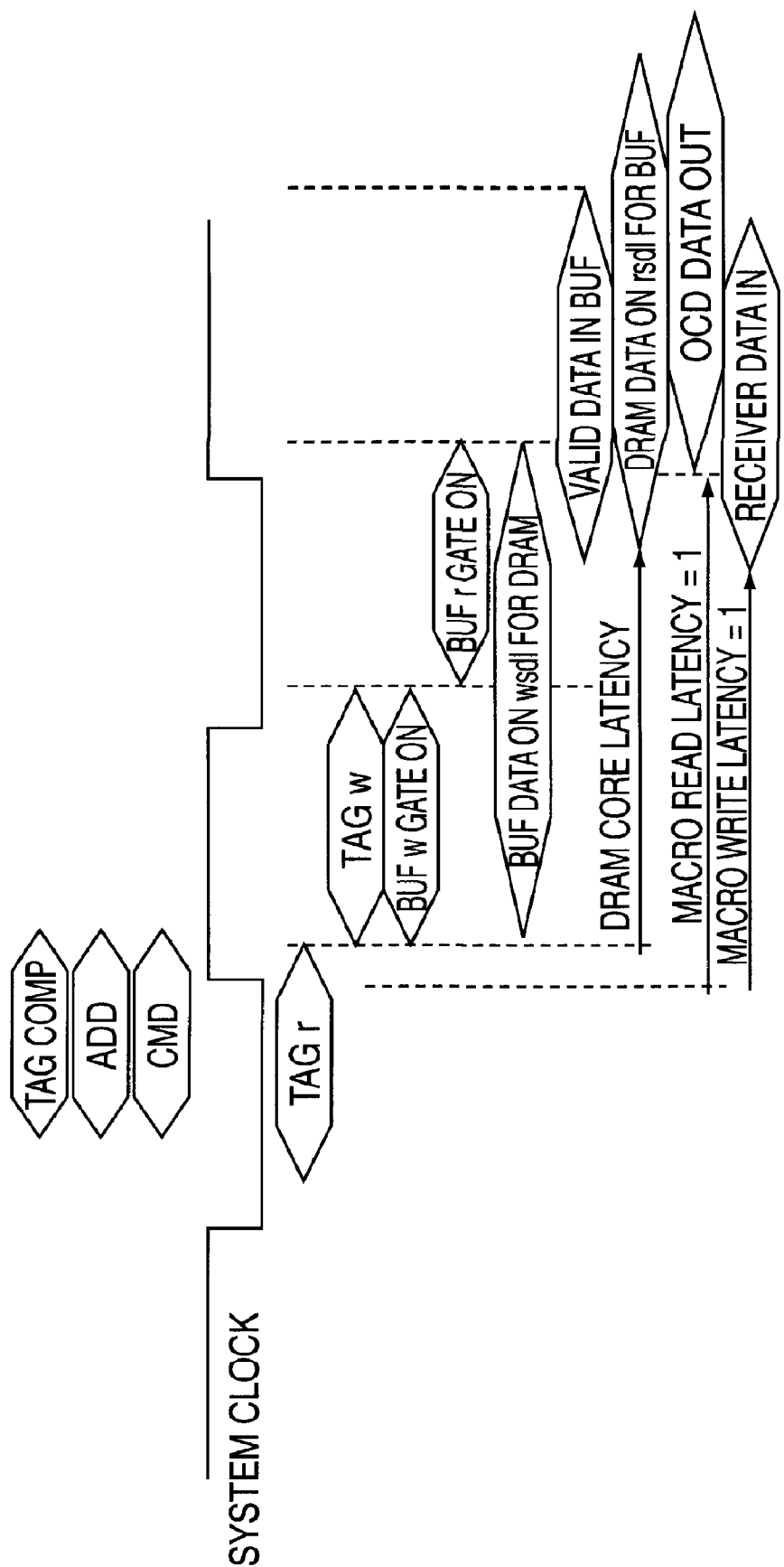
FIG. 5(b) is a timing diagram which illustrates the operation of the buffer structure shown in FIG. 4.
Figure 5C:
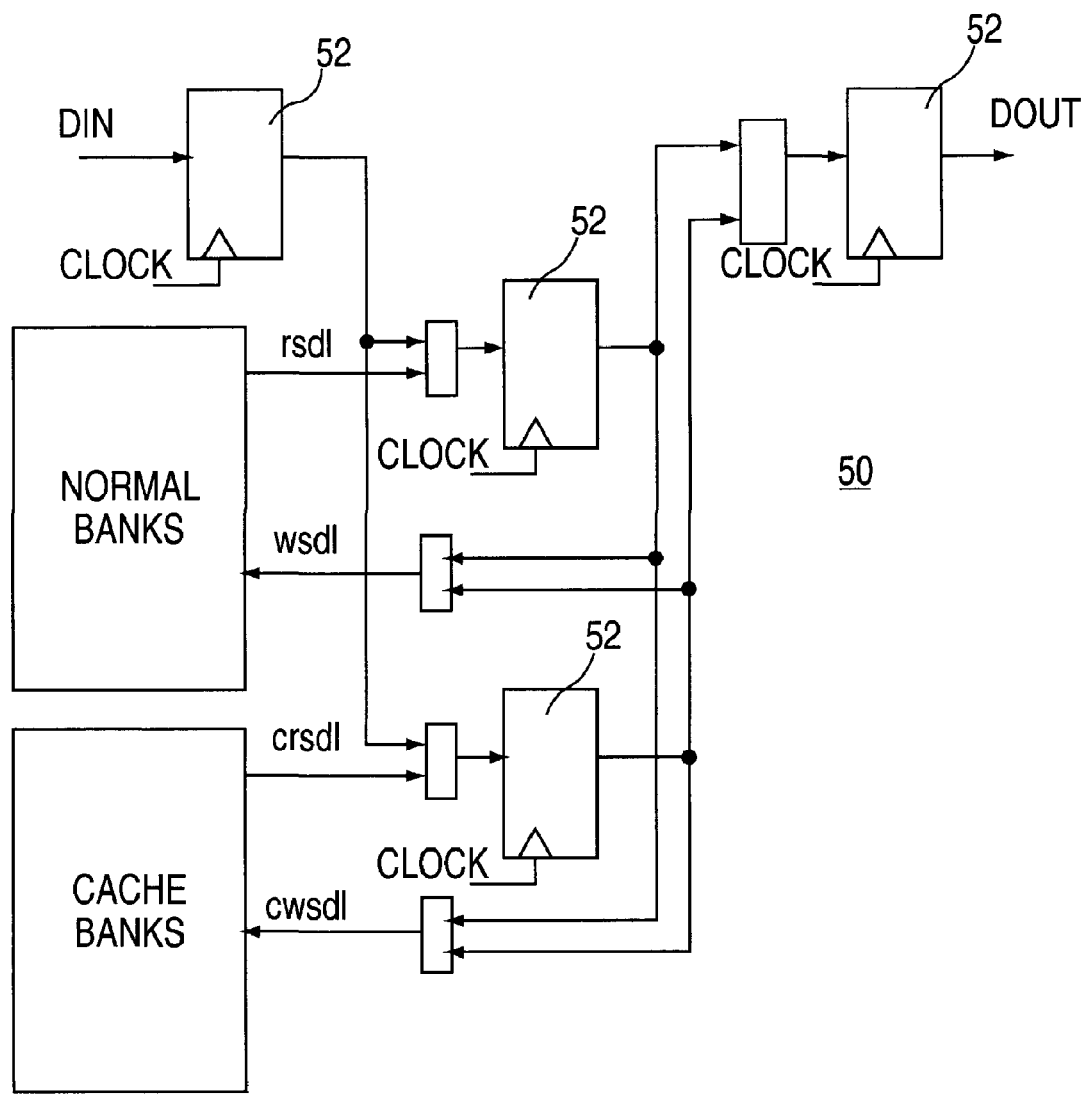
FIG. 5(c) is a schematic diagram of an alternative embodiment of the buffer structure shown in FIG. 4.

Referring now to FIG. 5(*b*), there is shown a timing diagram which illustrates the operation of the buffer structure shown in FIG. 4(*a*). Again, there is an assumed setup time for the command, address and data corresponding to the new request. Because the associated logic is relatively simple, a small amount of time (e.g., about 0.5 ns in 0.13 micro technology) may be sufficient. Otherwise, a delayed clock may be implemented for internal DRAM operation. During the setup time, the address information (add) is used for tag comparison, and command (cmd) is used to see if a request for data transfer exists. Command is also pipelined to the next clock so that a read (or write) command is then performed from (or to) the data buffers, as in a read (write) latency 1 operation. In this level sensitive latch scheme, the "w" gates 44 in FIG. 4(*a*) are turned on during the first half of the clock cycle and turned off for the second half of the clock cycle, thereby allowing data to be sent to WSDL 42 and latched for one clock. The "r" gates 36, 40 are turned on for the second half of the clock cycle, allowing the valid data from the DRAM banks to come in as the macro read latency is assumed to be less than one clock cycle. The data is then latched into the register buffers at the rising edge of the next cycle. If a read command is received, the data is read from the buffer (associated with the requested address) to data_out lines 30*b*. If a write command is received, the data is written from the data_in lines 30*a* to the buffer which is associated with the requested address.

It should be noted that, regardless of whether the request is a read, write or write with bit masking, for the proposed random access memory system, internal operation will first bring the data page associated to the requested wordline into one of the buffers, where a read (copy the data out to data_out 30*b*) or write (update the data page with input on data_in 30*a*) is performed. Except for the operation on data_in and data_out lines and controlling gates gw0, gw1, rw0, rw1, the scheduling algorithm and data movement for DRAM banks, cache, and buffers are identical for read and write requests.

An alternative buffer scheme 50 based upon positive clock edge triggered latches 52 is shown in FIG. 5(*c*). Here, one clock cycle is used for tag read and comparison to be more consistent with ASIC methodologies. Using one clock tag comparison, FIG. 5(*d*) illustrates a timing flow consistent with the clock edge triggered design of FIG. 5(*c*). The read latency in this embodiment is two clocks. It will be noted that two consecutive commands (request 1 and request 2) are stacked sequentially and executed in a seamless pipeline fashion as shown in FIG. 5(*d*). In the next section of the description, it will be shown that seamless stacking for any random sequence is possible by implementing a path-independent algorithm specifically designed for the DRAM system 10.

II. Scheduling Algorithms

In order to successfully use the above described architecture of a destructive read DRAM array having a destructive read cache, an appropriate scheduling scheme should be in place such that the system is maintained in an allowable state following any new random access request. The general approach is to first define the allowable states, initialize the system to conform to the allowable states (i.e., initialization), and then ensure the allowable states are maintained after any given data transfer operation (i.e., system continuity).

Rules of Allowable States (Strong Form)

In a preferred embodiment, "strong form" rules of allowable states are defined, characterized by a symmetric algorithm that maintains valid data in both buffers, the data having the same wordline address, but from a different DRAM bank. Accordingly, at the rising edge of every clock cycle, the following rules are to be satisfied:

Rule #1—There is stored in each of the two buffers a data word, having a common wordline address with one another. One of the two data words in the buffers is the specific data corresponding to the bank address and wordline address from the preceding random access request.

An example of this rule may be that buffer 0 contains the data read from DRAM bank 2, wordline 3 (as requested from the previous cycle), while buffer 1 contains data previously read from wordline 3 of the cache (either cache bank A or cache bank B) and associated to bank 4, wordline 3.

Rule #2—There is no valid data currently associated with the above wordline address (i.e., the particular wordline address associated with the data in the buffers) in the cache.

In continuing with the above example, neither cache bank A nor cache bank B would have valid data stored at wordline address 3. That is, A=0 and B=0 at wordline 3 of the cache tag.

Rule #3—For every wordline address other than the one corresponding to that of the buffers, there is one and only one valid data word stored in one and only one cache bank.

Thus, in the above example, for every wordline address other than wordline address 3, either (A=1 and B=0), or (A=0 and B=1).

It should also be noted that under Rule #1, the data page associated with the requested bank and wordline address (for read or write) will arrive at the buffer at the next clock cycle for the appropriate read and write operation. Given the rules of allowable states outlined above, for any random access request (read/write), it is thus possible to execute a predefined procedure under which the proposed system will be both initialized and subsequently maintained in the allowable states for any clock cycle.

Initialization

The first part of the strong form algorithm begins with an initialization procedure. Following system power-up, the buffer tag 22 (from FIG. 3 as previously discussed) is set as follows: (1) the valid flags for buffer 0 and buffer 1 are set to be "1"; (2) the row address corresponds to wordline 0; (3) the bank address for buffer 0 is bank 1; (4) the bank address for buffer 1 is bank 0; and (5) the request flag for both buffers is 0 since there is no previous request.

In addition, following system power-up, with the exception of wordline 0, each flag for cache bank A of cache tag 18 is initialized to A=1, while all bank addresses in the cache tag 18 are set to bank 0. Each flag for cache bank B is initialized to B=0. By setting the buffer and cache tag as stated above, buffer 0 corresponds to a valid data word associated with bank 1_wordline 0, while buffer 1 corresponds to a valid data word associated with bank 0_wordline 0. Finally, with the exception that wordline 0 corresponds to no valid data, all other wordlines in the dual bank cache have valid data associated with bank 0 in cache bank A. Therefore, the above stated strong form rules are initially satisfied.

Continuity

Following initialization, it will be assumed that a random read or write request is made shortly before the rising edge of a clock cycle. At the rising edge of the clock cycle, the random access request (read or write) shall hereinafter be designated by $X_j$, wherein "X" is the bank address and "j" is the wordline number (address). The term $D_i$ shall represent the data page initially stored in buffer 0, wherein "D" is the bank address and "i" is the wordline number. The term $Q_i$ shall represent the data page initially stored in buffer 1, wherein "Q" is the bank address and "i" is the wordline number. It will be noted that in accordance with rule #1 stated above, D≠Q in all cases, and the wordline number (i) is the same for buffer 0 and buffer 1.

As is also the case under rule #2 and rule #3, for any given wordline number k≠i, there is one and only one valid data page associated with the wordline k stored in the cache. The term C(k) is hereby designated as the corresponding bank address for wordline k in the cache tag. Therefore, for any given request $X_j$, the data will be found in either the associated DRAM bank, one of the two buffers, or the cache. The following illustrates the resulting data transfer operations executed for each of the three general possible scenarios:

CASE 1—Buffer Hit

In this case, j=i, and either X=D or X=Q. That is, the requested data is already stored in either buffer 0 or buffer 1. Since the rules for the allowable states are already satisfied, no further data transfer is implemented in this clock cycle. This is reflected by the lack of change in the state diagram of FIG. 6(a).

CASE 2—Cache Hit

If the requested data $X_j$ is contained in the cache, then j≠i (under Rule #2). That is, the wordline number of the requested data does not correspond to the wordline of the data in the buffers. Furthermore, since a single page of data cannot correspond to two bank addresses, then either X≠D or X≠Q, or both.

If X≠D, then the data for $D_j$ is not in the buffer (from the above paragraph) or in the cache (under Rule #3), thus the data for $D_j$ is in the corresponding DRAM bank. The following steps are then implemented to conform to the above rules for allowable states:

$X_j$ is moved from one cache bank (either A or B) to buffer 1;

$D_i$ is moved from buffer 0 to the other cache bank (B or A);

$Q_i$ is moved from buffer 1 to DRAM bank Q;

$D_j$ is moved from DRAM bank D to buffer 0.

This series of data shifts is illustrated in FIG. 6(b). On the other hand, if X=D, then it must be true that X≠Q, and the data for $Q_j$ is found in the corresponding DRAM bank. Accordingly, the following steps are then implemented:

$X_j$ is moved from one cache bank (either A or B) to buffer 1;

$Q_i$ is moved from buffer 1 to the other cache bank (B or A);

$D_i$ is moved from buffer 0 to DRAM bank D;

$Q_j$ is moved from DRAM bank Q to buffer 0.

This series of data shifts is illustrated in FIG. 6(c).

CASE 3a—Buffer Miss, Cache Miss, j=i

If the requested data $X_j$ is neither in the buffers nor in the cache, then it ($X_j$) is in the corresponding DRAM bank. Since j=i, it is also true that X≠D. Thus, a conforming operation may be performed in two steps, as illustrated in FIG. 6(d):

$X_j$ is moved from DRAM bank X to buffer 0;

$D_i$ is moved from buffer 0 to DRAM bank D.

CASE 3b—Buffer Miss, Cache Miss, j≠i, X≠D

In this case, the requested data is again located in the corresponding DRAM bank. However, the wordline address of the requested data is different than the wordline address of the data in the buffers. Under the rules of allowable states, there exists a valid $C_j$ for row address j stored in one of the cache banks. Since X≠D, then the bank address of the requested data is different than the bank address of the data in buffer 0, and the following steps are implemented:

$X_j$ is moved from DRAM bank X to buffer 0;

$C_j$ is moved from one cache bank (A or B) to buffer 1;

$Q_i$ is moved from buffer 1 to the other cache bank (B or A);

$D_i$ is moved from buffer 0 to DRAM bank D.

This series of data shifts is illustrated in FIG. 6(e).

CASE 3c—Buffer Miss, Cache Miss, j≠i, X=D, X≠Q

The only difference between this case and CASE 3b above is that the bank address of the requested data is now the same as the bank address of the data contained in buffer 0 (i.e., X=D). However, it must be true that the bank address of the requested data is different than the bank address of the data contained in buffer 1 (i.e., X≠Q). Thus, the following steps are implemented as shown in FIG. 6(f):

$X_j$ is moved from DRAM bank X to buffer 0;

$C_j$ is moved from one cache bank (A or B) to buffer 1;

$D_i$ is moved from buffer 0 to the other cache bank (B or A);

$Q_i$ is moved from buffer 1 to DRAM bank Q.

An alternative embodiment of the initialization procedure may be useful in helping to the system to reduce soft error rate (SER) by not storing any data in buffers for a long time. In such an embodiment, following system power-up, each flag for cache bank A of cache tag 18 is initialized to A=1, while all bank addresses in the cache tag 18 are set to the same address (e.g., 000), and the valid flags for tag buffer 22 are both set to be "0".

Referring now to FIG. 7, there is also shown the state diagram for the initialization procedure described above, wherein for a cache hit ($C_i$) for the first request, the data is moved from the cache to buffer 1; for a cache and buffer miss (Di), the data is moved from DRAM bank D to buffer 0.

Finally, FIG. 8 is a state diagram of an optional data shifting operation that may be performed if no request is received during a given clock cycle. Because of the possibility of soft error rate (SER), it may be desirable not to keep data stored in the buffers if there is no request from a customer (external device). In this case, the data Di in buffer 0 is returned to DRAM bank D, while the data Qi in buffer 1 is sent to one of the cache banks.

The above described data shifting algorithm under the "strong form" rules of allowable states is advantageous in that by always having both buffer contain valid data, the requested data can be transferred to one of the buffers during one clock cycle while still maintaining the system in an allowable state. As can be seen from the various possibilities outlined above, at most there is only four data transfer operations and the data transfer logic is relatively easy to implement. However, the strong form rules may be generalized for tradeoffs between performance, power and the number of logic gates in the system implementation thereof. Accordingly, a "general form" algorithm is also presented.

Briefly stated, a "general form" allows for more allowable states in the buffers, thereby reducing the number of required data transfer operations. This, in turn, results in less power dissipated in the device. On the other hand, a tradeoff is that extra logic is used to handle the increase in allowable states. By way of comparison, FIG. 9 is a table illustrating the allowable states under the strong form rules, while FIGS. 10(*a*)–(*d*) illustrate the allowable states under the general form rules. As can be seen, in addition to buffers 0 and 1 containing valid data, either buffer or both may also be empty. The rules for allowable states for the general form may be summarized as follows:

Rules of Allowable States (General Form):

Rule #1—Two or less valid data pages may be located in the two buffers. If each buffer happens to contain valid data, then the data in each has the same wordline address. However, if a random access request was made during the previous cycle, then one of the buffers must contain the data corresponding to the previous random access request.

Rule #2—If either or both of the buffers contain any valid data pages (associated with a particular wordline address) therein, there is no valid data having that same wordline address stored in the cache.

Rule #3—For all wordline addresses other than the particular one stated in Rule #2, there is at most one valid data word associated with the wordline address stored in one and only one cache bank. That is, for every wordline address other than the one stored in the buffer tag with a valid flag (FIG. 3), A and B (FIG. 2) can not be equal to 1 at the same time.

Under the above stated general form rules, a low power method is implemented to reduce the number of moves needed, in contrast to the strong form method. For example, in the cache hit case (CASE 2) discussed earlier, the data transfer from a DRAM bank to a buffer under the strong form rules of allowable states is unnecessary under the general form rules of allowable states. In addition, under the general form rules of allowable states, certain valid data words (e.g., Di, Qi and Cj), which are the starting points of some earlier described data shifts, may not be present in the initial system state during a random access request. Thus, the symmetrical moves to and from the other buffer are no longer required.

With the general form rules, the minimum number of data shifts needed is determined for each particular cycle. It will be noted that in a case where only one of the buffers contains a valid data page initially, that page may be sent to either the cache or the DRAM bank. However, in a preferred embodiment, the selected operation is to move the data to the DRAM bank. If the data were instead moved to the cache, a subsequent DRAM bank hit having the same wordline address would result in that data having to be moved from the cache back to the buffer. Since a DRAM bank hit (buffer and cache miss) is the statistically the most likely event upon a random access request, it follows that data should be moved from a buffer to DRAM bank whenever possible to reduce the number of shifting operations. If n represents the total number of DRAM banks in the system, and m represents the number of wordlines per DRAM bank, then the probability for a buffer hit during a request is less than $2/(n*m)$, while the probability of a cache hit is less than $1/n$. Conversely, the probability of a DRAM bank hit (buffer and cache miss) is roughly $(n-1)/n$. Thus, the larger the value of n and m, the greater the probability of a DRAM bank hit for a random access operation. The initialization procedure under the general form may be realized as a more conventional system. For example, all valid data may be put into the normal DRAM banks by setting all valid flags for the cache and buffers to "0".

The following methodology outlines the data transfer operations governed by the general form rules. If no random access request is received, then one of Di or Qi (if either are present in buffer 0 or buffer 1) is moved back to the respective DRAM bank (DRAM bank D or DRAM bank Q). If a random access request Xj is received, there may be initially a valid Di in buffer 0, a valid Qi in buffer 1, and a valid Cj in the cache, or any combination thereof as outlined in the general form rules. Possible cases are as follows:

CASE 1—Buffer Hit

As with the strong form rules, j=i and either X=D or X=Q. That is, the requested data is already stored in either buffer 0 or buffer 1 by definition. Since the general form rules for the allowable states are already satisfied, no further data transfer is implemented in this clock cycle. This is reflected by the lack of change in the state diagram of FIG. 11(*a*).

CASE 2—Cache Hit

It is desired to move the requested data Xj from its current location in one of the cache banks to buffer 1. If there is any valid data in either or both buffers, the data will be moved out, preferably to the corresponding DRAM bank(s) whenever possible. Regardless of the status of the two buffers:

Xj is moved from one cache bank (either A or B) to buffer 1;

Now, if both buffers contain valid data, then the further operations are:

Di is moved from buffer 0 to the other cache bank (B or A); and

Qi is moved from buffer 1 to DRAM bank Q.

Otherwise, if only one of the two buffers contain valid data, then:

either Di is moved from buffer 0 to the other cache bank (A or B); or

Qi is moved from buffer 1 to the other cache bank (B or A).

Figure 11C:
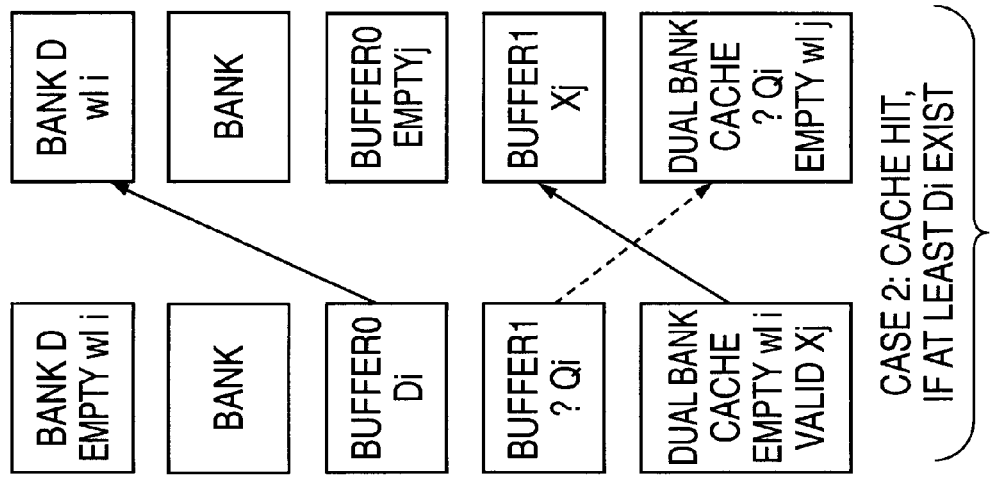
Figure 11B:
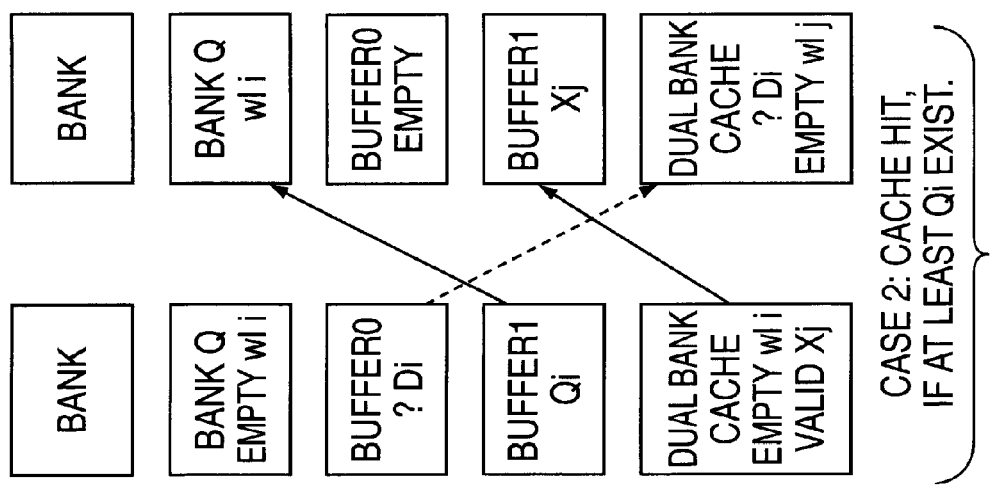
Figure 11A:
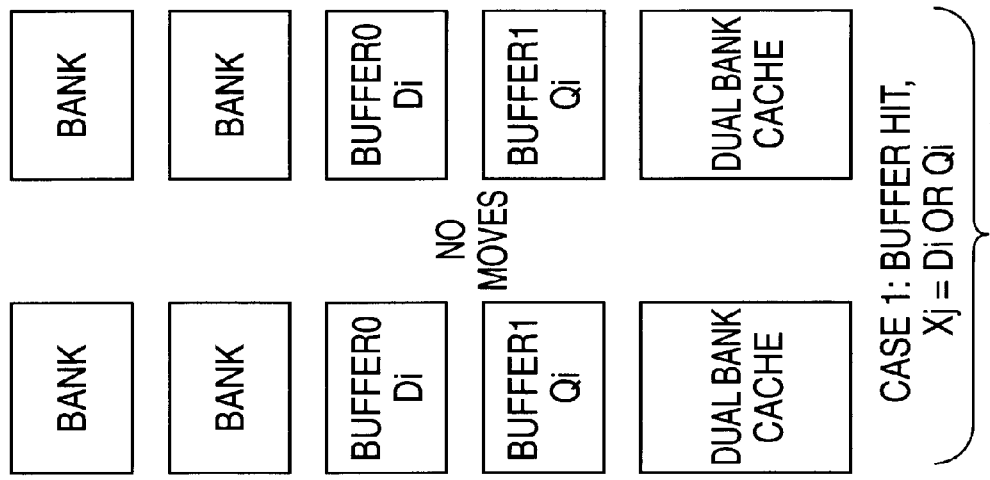

Naturally, if neither buffer contains valid data initially, then no additional operations are performed besides moving Xj from the cache to buffer 1. The above series of data shifts is illustrated in FIGS. 11(*b*) and 11(*c*).

CASE 3a—Buffer Miss, Cache Miss, j=i, at Least One Buffer has Valid Data.

If the requested data is neither in the buffers nor in the cache, then it (Xj) is in the corresponding DRAM bank. Assuming at least one buffer has valid data initially, and further assuming j=i, it is also true that X≠D and X≠Q, if Di or Qi exist. Thus, a conforming operation may be performed in two moves, as illustrated in FIG. 11(d), where Di is assumed to exist:

Xj is moved from DRAM bank X to buffer 0;
Di is moved from buffer 0 to DRAM bank D.

CASE 3b—Buffer Miss, Cache Miss, j≠i, at Least One Buffer has Valid Data

In this case, the requested data is again located in the corresponding DRAM bank. However, the wordline address of the requested data is different than the wordline address of the data in one or both of the buffers. Under the general rules of allowable states, there may exist a valid Cj for row address j stored in one of the cache banks. It will first be assumed that Cj, Di and Qi each exist initially. As such, it must be true that X≠D, or X≠Q, or both. If X≠D, then the following steps are implemented:

Xj is moved from DRAM bank X to buffer 0;
Cj is moved from one cache bank (A or B) to buffer 1;
Qi is moved from buffer 1 to the other cache bank (B or A);
Di is moved from buffer 0 to DRAM bank D.

However, if X=D, then X≠Q, and the following steps are implemented:

Xj is moved from DRAM bank X to buffer 0;
Cj is moved from one cache bank (A or B) to buffer 1;
Di is moved from buffer 0 to the other cache bank (B or A);
Qi is moved from buffer 1 to DRAM bank Q.

If Cj exists and only one of Di and Qi exists, then no corresponding moves are made as the starting point for such moves do not exist. The final results will still conform to the general form rules.

Next, it will be assumed that Cj does not exist, but Di and Qi both exist. Then, if X≠D, then the following steps are implemented:

Xj is moved from DRAM bank X to buffer 0;
Qi is moved from buffer 1 to either cache bank (A or B);
Di is moved from buffer 0 to DRAM bank D.

Otherwise, if X=D, then X≠Q, then the following steps are implemented:

Xj is moved from DRAM bank X to buffer 0;
Di is moved from buffer 0 to either cache bank (A or B);
Qi is moved from buffer 1 to DRAM bank Q.

Now, if Cj does not exist and there is only one valid data page in the buffers (either Di exists or Qi exists, but not both), and if X does not correspond to the buffer data (X≠D or X≠Q), then the following steps are implemented:

Xj is moved from the DRAM bank to buffer 0;
the valid buffer data is moved to the corresponding DRAM bank.

Otherwise, if the one valid data page in the buffers does correspond to X (X=D or X=Q), the following steps are implemented:

Xj is moved from the DRAM bank to buffer 0;
the valid buffer data is moved to a cache bank (B or A)

Finally, if none of Cj, Di or Qi exist, then the only operation performed is to move Xj into buffer 0.

The series of data shifts is illustrated in FIGS. 11(e) and 11(f).

It has thus been shown how a destructive read, DRAM based cache may be used in conjunction with a destructive read DRAM array to reduce random access cycle time to the array. Among other advantages, the present system provides significant area savings, compatibility in process integration, and reduced soft error concerns over other system such as those using SRAM based caches.

One specific key of the system architecture includes the dual bank cache structure, wherein simultaneous read and write access operations may be executed. In addition, the architecture also includes the two buffers which are used to redirect the data transfers. The cache tag and buffer tag contain all the information associated with data pages stored in the current state, thereby representing enough information upon which to make a deterministic decision for data shifting for the next clock cycle. Thus, no historical data need be stored in any tags.

By defining the concept of allowable states (as exemplified by the strong form rules and the general form rules), path independent algorithms may be designed such that all future data shifts are dependent only upon the current state, rather than the history preceding the current state. Any sequence of successive operations may be stacked together, and thus all random access may be seamlessly performed. Moreover, the requested data reaches a final state in a limited number of cycles (i.e., the requested data reaches a buffer in one clock cycle if setup time is used, or in two clock cycles if one clock pipe is used for tag comparison). Given the nature of path independence, as well as the fact that the random access requests are completed during limited cycles, there are only a limited number of test cases that exist. Thus, the DRAM cache system may be completely verified with test bench designs.

As stated previously, the allowable states under the strong form rules are a subset of the allowable states under the general form rules. Accordingly, the "symmetrical algorithm" used in conjunction with the strong form rules will generally include simpler logic but result in higher power consumption. The "low power" algorithm has less power dissipation but generally more logic components with more tag comparison time associated therewith. It will be noted, however, that the present invention embodiments also contemplate other possible rules for allowable states and associated algorithms, so long as path independence is maintained.

It is further contemplated that for the present destructive read, random access memory system cached by destructive read memory, the number of DRAM banks used as cache may be more than two. The number of buffers may also be more than two. Any additional cache banks and buffers could be used in conjunction with alternative architectures or in different operating configurations such as multi-cycle latency from the core. The number of cache banks may also be reduced to one for systems using caches of twice faster cycle time. The buffers may be replaced with multiplexers if latching functions are provided elsewhere, such as in local DRAM arrays or in global data re-drivers. Where chip area is less of a concern, the above architecture and/or algorithms may also be applied to an SRAM cache based system. The above architecture and/or algorithm may also be applied to a single port or dual port SRAM cache based system, for more margins of operation in terms of cache latency, or for possibly better redundancy handling, or for other performance or timing issues.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory storage system, comprising:
a plurality of memory storage banks comprising destructive read memory components configured for delayed write back scheduling thereto;
a cache in communication with said plurality of memory storage banks, said cache also comprising destructive read memory components configured for delayed write back scheduling thereto; and
a line buffer structure in communication with said plurality of memory storage banks and said cache, wherein said line buffer structure includes a pair of buffers;
wherein each of said pair of buffers is capable of storing a data page therein, said data page including data bits destructively read from a selected wordline of a selected DRAM storage bank, or a selected wordline of a selected DRAM cache bank.

2. The memory storage system of claim 1, wherein said destructive read memory storage components of both said plurality of memory storage banks and said cache comprise dynamic random access memory (DRAM) storage cells.

3. The memory storage system of claim 1, wherein said cache includes a portion of said plurality of memory storage banks.

4. The memory storage system of claim 1, further comprising:
a buffer tag associated with said line buffer structure; and
a cache tag associated with said cache.

5. The memory storage system of claim 4, wherein:
said plurality of memory storage banks further comprises a number, n, of DRAM storage banks, each of said n DRAM storage banks having a number, m, of wordlines associated therewith; and
said cache further includes a pair of DRAM cache banks, said pair of DRAM cache banks each having said number, m, of wordlines associated therewith.

6. The memory storage system of claim 5, wherein data originally contained within one of said number of DRAM storage banks may be stored in one of said pair of DRAM cache banks.

7. The memory storage system of claim 5, wherein each of said pair of buffers comprise level sensitive latches.

8. The memory storage system of claim 6, wherein:
any data contained in said pair of DRAM cache banks that is originally associated with said number of DRAM storage banks is stored therein through a direct mapping scheme;
wherein data associated with a given wordline address within one of said number of DRAM storage banks is stored within said given wordline address within one of said pair of DRAM cache banks.

9. A dynamic random access memory (DRAM) system, comprising:
a number (n) of DRAM storage banks, each of said n DRAM storage banks having a number (m) of wordlines associates therewith;
a cache, said cache including a first DRAM cache Bank and a second DRAM cache bank, both said first DRAM cache bank and said second DRAM cache bank having said number M of wordlines associated therewith;
a line buffer structure, said line buffer structure including a pair of buffers capable of storing data read from said DRAM storage banks and said first and second DRAM cache banks; and
a control algorithm for controlling the transfer of data between said DRAM storage banks, said pair of buffers and said DRAM cache banks;
wherein data read from said DRAM storage banks and said DRAM cache banks is destructively read therefrom in a manner that provides for a delayed write back of data thereto.

10. The DRAM system of claim 9, further comprising:
a cache tag for storing DRAM storage bank address information of data contained within a given wordline of said DRAM cache banks; and
a buffer tag for storing DRAM storage bank address information of data contained within said pair of buffers.

11. The DRAM system of claim 10, wherein said buffer tag further comprises:
a first flag which indicates whether valid data exists within said pair of buffers; and
a second flag which indicates whether randomly requested data is contained in either of said pair of buffers.

12. The DRAM system of claim 9, further comprising:
a data-in bus, said data-in bus for receiving externally originating data into the DRAM system, through said buffer structure;
a data-out bus, said data-out bus for transmitting internally stored data out of the DRAM system;
a read secondary data line for transmitting data from said DRAM storage banks to one of said pair of buffers;
a cache secondary data line for transmitting data from said DRAM cache banks to the other of said pair of buffers;
a write secondary data line for transmitting data from either of said pair of buffers to said DRAM storage bank; and
a cache write secondary data line for transmitting data from either of said pair of buffers to said DRAM cache banks.

13. The DRAM system of claim 12, wherein said pair of buffers further comprise level sensitive storage latches.

14. The DRAM system of claim 12, wherein said pair of buffers further comprise edge triggered latches.

* * * * *